(12) United States Patent
Ishihara et al.

(10) Patent No.: US 6,255,803 B1
(45) Date of Patent: Jul. 3, 2001

(54) METHOD FOR DETECTING MINOR SHORT IN CELLS AND METHOD FOR DETECTING CELL SHORT IN CELLS

(75) Inventors: Hirotaka Ishihara, Osaka; Masahiro Takada; Toshiaki Nakanishi, both of Aichi, all of (JP)

(73) Assignees: Matsushita Electric Industrial Co., Ltd., Kadoma; Toyota Jidosha Kabushiki Kaisha, Aichi, both of (JP)

( * ) Notice: Subject to any disclaimer, the term of this patent is extended or adjusted under 35 U.S.C. 154(b) by 0 days.

(21) Appl. No.: 09/635,039

(22) Filed: Aug. 4, 2000

(30) Foreign Application Priority Data

Aug. 10, 1999 (JP) .................................. 11-226938

(51) Int. Cl.[7] ........................ H01M 10/44; H01M 10/46
(52) U.S. Cl. ............................................. 320/134; 320/136
(58) Field of Search ................................... 320/127, 128, 320/132, 134, 136, 137, DIG. 21

(56) References Cited

U.S. PATENT DOCUMENTS

| | | |
|---|---|---|
| 4,280,097 | * 7/1981 | Carey et al. . |
| 4,303,877 | * 12/1981 | Meinhold . |
| 5,547,775 | * 8/1996 | Eguchi et al. . |
| 5,977,751 | * 11/1999 | Blessing et al. . |

FOREIGN PATENT DOCUMENTS

| | | |
|---|---|---|
| 5-180913 | 7/1993 | (JP) . |
| 2754506 | 3/1998 | (JP) . |
| 11-178225 | 7/1999 | (JP) . |
| 2000-14029 | 1/2000 | (JP) . |

* cited by examiner

*Primary Examiner*—Edward H. Tso
(74) *Attorney, Agent, or Firm*—Renner, Otto, Boisselle & Sklar LLP

(57) ABSTRACT

A method for detecting a minor short in at least one of a plurality of cells of a battery pack includes: a first step of measuring a voltage of at least one of the plurality of cells in a process of charging the battery pack; a second step of measuring a voltage of the at least one of the plurality of cells in a process of discharging the battery pack; and a third step of detecting the minor short in the at least one of the plurality of cells based on measurement results from the first step and the second step.

20 Claims, 5 Drawing Sheets

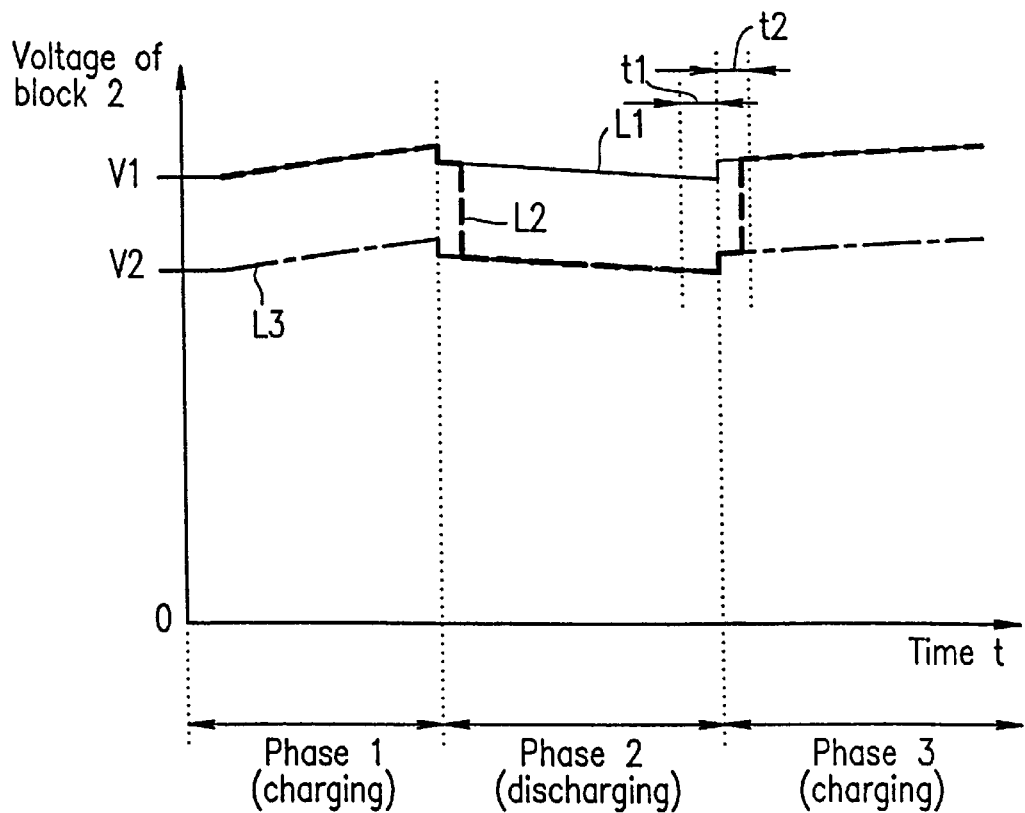

FIG.3

Voltage characteristic graph when alternately charging and discharging block 2 in battery pack 1.

——— Thin line L1 which represents fluctuations in voltage of block 2 consisting only of normal cells.

– – – Broken line L2 which represents fluctuations in voltage of block 2 including a minor-shorted cell.

—·— One-dot chain line L3 which represents fluctuations in voltage of block 2 including a shorted cell.

FIG. 4
Example of grouping in battery pack 1
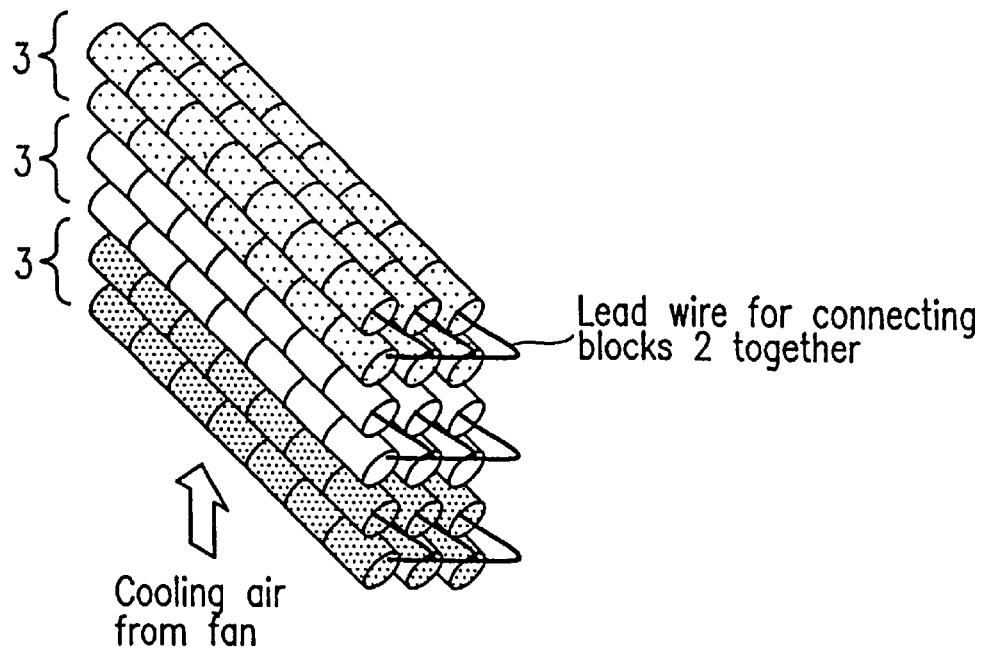
 Cell of block 2 of battery pack 1
 Battery cells corresponding to group A
 Battery cells corresponding to group B
 Battery cells corresponding to group C
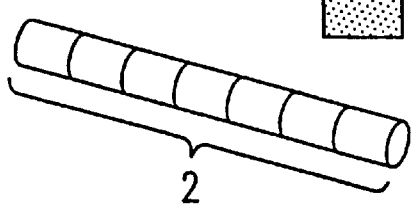 1 block of battery cells

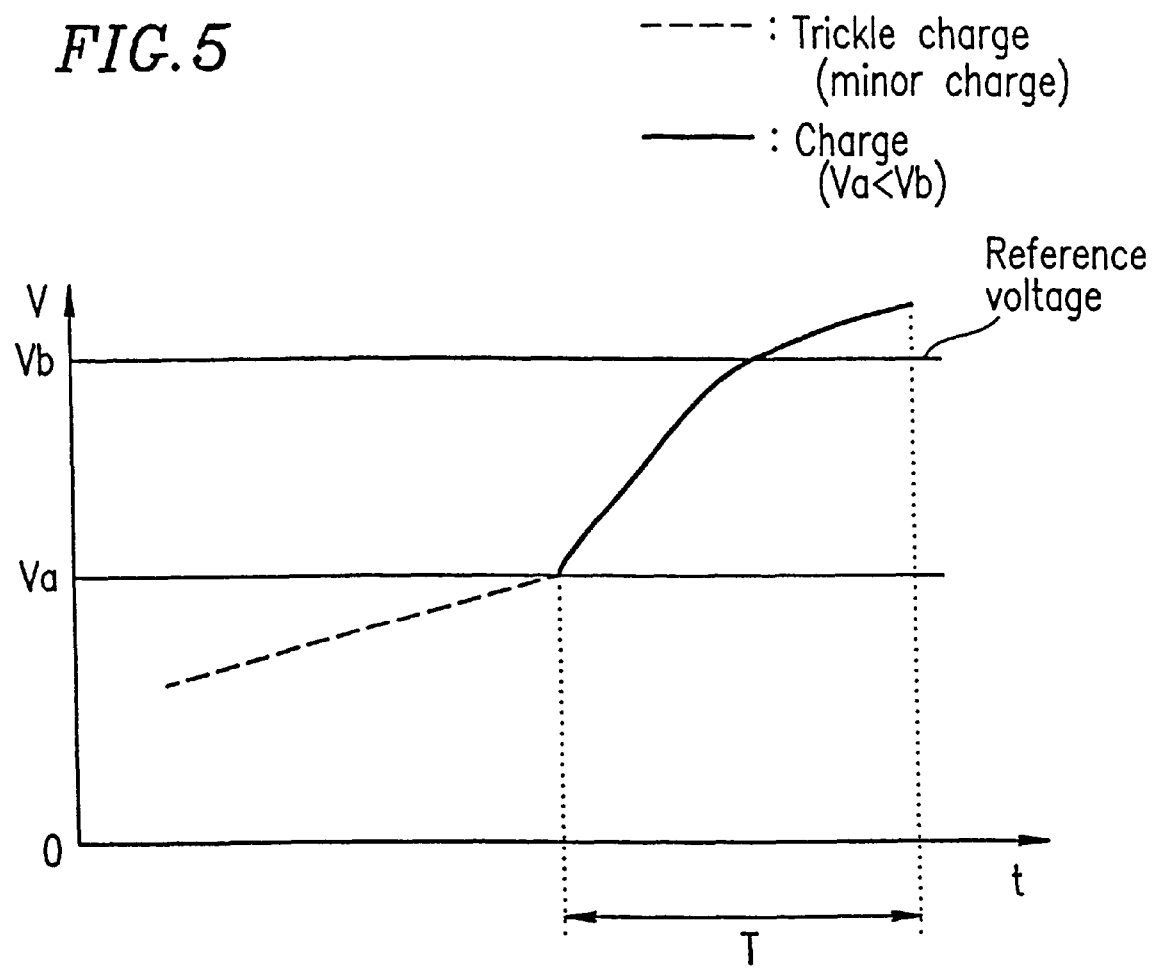

METHOD FOR DETECTING MINOR SHORT IN CELLS AND METHOD FOR DETECTING CELL SHORT IN CELLS

BACKGROUND OF THE INVENTION

1. Field of the Invention

The present invention relates to an apparatus and a method for detecting a short-circuit (or a "short") in a battery cell.

2. Description of the Related Art

When a battery cell is used in a system, a single battery cell may not produce a sufficient electric power to drive the system. Therefore, normally, a plurality of cells are serially connected together to produce a sufficient electric power. Such a group of serially-connected cells, which is capable of supplying a sufficient electric power to drive the system, is called a "battery pack", and the individual cells are also called "batteries".

A hybrid electric car uses a battery pack which includes as many as 240 battery cells. In a hybrid electric car, detection of a "cell short" (as defined below) is not performed because the detection cannot be performed by means of a conventional cell short determination method. Conventional cell short determination methods used in other systems include the following methods.

Japanese Patent No. 2,754,506 discloses a method in which a short of a single cell is determined by forcibly charging a certain amount of electricity into a plurality of serially connected batteries and then determining whether the voltage of the serially connected batteries can be increased over a predetermined value. Japanese Patent No. 1,253,012 discloses a method in which a cell short is determined by detecting a sound of bubbling from the electrolytic solution which is generated when rapidly discharging the battery.

FIG. 5 illustrates the conventional cell short determination method disclosed in Japanese Patent No. 2,754,506. In order to determine a cell short in a battery, the battery is charged for a predetermined period of time T. Then, the battery voltage is detected after the passage of the period of time T, and the detected battery voltage is compared with a predetermined reference voltage Vb. It is determined that at least one of the battery cells has a short when the battery voltage is not equal to or greater than the predetermined reference voltage Vb.

Where it is not possible to detect a single cell short which has occurred in a battery pack, there are a number of problems as follows.

1. Cells in a battery pack are grouped into blocks by several cells so as to reduce the influence of a difference in a remaining capacitance among the cells caused by a temperature distribution across the battery pack. Estimation of the capacitance of the battery is performed for each block by using a voltage as an index. However, the remaining capacitance may not be estimated accurately in a block including a shorted cell due to a low voltage. Therefore, even if the block including a shorted cell is in a state of being overcharged, the block is charged further. As a result, operational lives of even normal cells in blocks other than the block including a shorted cell are shortened by the overcharge.

2. The voltage of the block including a shorted cell appears to be lower than that of the remaining capacitance. Therefore, the capacitance of the battery pack is determined to be low even if a sufficient capacitance is remaining in the other normal cells. As a result, discharging of the whole battery pack is stopped. Thus, the capacitance of the battery pack is not used efficiently.

Where the above-described conventional techniques are used, there are technical problems as follows:

1. In a system such as a hybrid electric car, where battery cells are charged or discharged according to the driver's operation of the accelerator, it is not possible to charge the cells continuously to determine whether a single cell is shorted. Therefore, it is not possible to determine a cell short by using the method of Japanese Patent No. 2,754,506 discussed above in which the battery cells are forcibly charged continuously.

2. It is not desirable in view of cost to provide a microphone on every single cell to detect a sound as in Japanese Patent No. 1,253,012 discussed above.

3. The voltage of a battery varies greatly according to the remaining capacitance and the charging/discharging current. Thus, a voltage drop resulting from a short of a cell is made inconspicuous in comparison with a substantial change in voltage due to the remaining capacitance and/or the charging/discharging current. Accordingly, it is difficult to detect a short of a cell.

The present invention uses a different method from the conventional methods to detect a short of a cell and solve the problems described above.

SUMMARY OF THE INVENTION

In one aspect of the invention, a method for detecting a minor short in at least one of a plurality of cells of a battery pack includes: a first step of measuring a voltage of at least one of the plurality of cells in a process of charging the battery pack; a second step of measuring a voltage of the at least one of the plurality of cells in a process of discharging the battery pack; and a third step of detecting the minor short in the at least one of the plurality of cells based on measurement results from the first step and the second step.

In one embodiment of the invention, the battery pack includes a plurality of blocks serially connected together, each of the blocks includes a number of cells among the plurality of cells which are serially connected together, the first step includes measuring a voltage of each of at least two of the plurality of blocks in the charging process, the second step includes measuring a voltage of the at least two of the plurality of blocks in the discharging process, the third step includes a fourth step of determining whether any of the cells of the at least two blocks has a minor short, the fourth step includes determining that at least one of the cells of the at least two blocks has a minor short if a condition that a difference in voltage between the two blocks is greater than a first predetermined threshold value holds for a first predetermined period of time or more in the discharging process and if the condition does not hold for a second predetermined period of time or more in the charging process.

In another embodiment of the invention, the plurality of blocks are grouped into a plurality of groups based on a previously measured temperature distribution among the blocks, each of the groups includes at least two blocks, the fourth step is performed based on a condition that a difference in voltage between two blocks in the same group is greater than the first predetermined threshold value.

In still another embodiment of the invention, the third step includes a fifth step of estimating a remaining capacitance from the voltages of the at least two blocks, in the case that a minor-shorted cell is detected in the fourth step, the fifth step subtracts a voltage value which corresponds to the first predetermined threshold value from a second threshold value predetermined for estimating the remaining capacitance to obtain a third threshold value, and compares the voltage value measured in the second step with the third threshold value.

In still another embodiment of the invention, the third step includes a sixth step of estimating a remaining capacitance from the voltages of the at least two blocks, in the case that a minor-shorted cell is detected in the fourth step, the sixth step adds the voltage value which corresponds to the first predetermined threshold value to the voltage value measured in the second step from the block including the minor-shorted cell to obtain an adjusted voltage value, and compares the adjusted voltage value with a second threshold value predetermined for estimating the remaining capacitance.

In still another embodiment of the invention, the first predetermined period of time and the second predetermined period of time are the same in length.

In still another embodiment of the invention, in the case that the minor short is detected, the third step includes a step of reducing a charging/discharging current value given to the battery pack to be smaller than that which is given in the normally controlled process.

In one aspect of the invention, a method for detecting a cell short in at least one of a plurality of cells of a battery pack includes: a first step of measuring a voltage of at least one of the plurality of cells in a process of charging the battery pack; a second step of measuring a voltage of at least one of the plurality of cells in a process of discharging the battery pack; and a third step of detecting the cell short in the at least one of the plurality of cells based on measurement results from the first step and the second step.

In one embodiment of the invention, the battery pack includes a plurality of blocks serially connected together, each of the blocks includes a number of cells among the plurality of cells which are serially connected together, the first step includes measuring a voltage of at least two of the plurality of blocks in the charging process, the second step includes measuring a voltage of the at least two of the plurality of blocks in the discharging process, the third step includes a fourth step of determining whether any of the cells of the at least two blocks has a cell short, the fourth step includes determining that at least one of the cells of the at least two blocks has a cell short if a condition that a difference in voltage between the two blocks is greater than a first predetermined threshold value holds for a first predetermined period of time or more in the discharging process and if the condition holds for a second predetermined period of time or more in the charging process.

In another embodiment of the invention, the plurality of blocks are grouped into a plurality of groups based on a previously measured temperature distribution among the blocks, each of the groups includes at least two blocks, the fourth step is performed based on a condition that a difference in voltage between two blocks in the same group is greater than the first predetermined threshold value.

In still another embodiment of the invention, the first predetermined period of time and the second predetermined period of time are the same in length.

In still another embodiment of the invention, in the case that the cell short is detected, the third step includes a step of outputting a signal which notifies a user of an abnormality of the battery pack.

In one aspect of the invention, a method for detecting a minor short in a cell includes: a first step of measuring a voltage of the cell in a process of charging the cell; a second step of measuring a voltage of the cell in a process of discharging the cell; and a third step of detecting the minor short in the cells based on measurement results from the first step and the second step.

In one embodiment of the invention, the third step includes determining that the cell has a minor short if a condition that a voltage of the cell is smaller than a first predetermined threshold value holds for a first predetermined period of time or more in the discharging process and if the condition does not hold for a second predetermined period of time or more in the charging process.

In another embodiment of the invention, the first predetermined period of time and the second predetermined period of time are the same in length.

In still another embodiment of the invention, in the case that the minor short is detected, the third step includes a step of reducing a charging/discharging current value given to the battery pack to be smaller than that which is given in the normally controlled process.

In one aspect of the invention, a method for detecting a cell short in a cell includes: a first step of measuring a voltage of the cell in a process of charging the cell; a second step of measuring a voltage of the cell in a process of discharging the cell; and a third step of detecting the cell short based on measurement results from the first step and the second step.

In one embodiment, the third step includes determining that the cell has a cell short if a condition that a voltage of the cell is smaller than a first predetermined threshold value holds for a first predetermined period of time or more in the discharging process and if the condition holds for a second predetermined period of time or more in the charging process.

In another embodiment of the invention, the first predetermined period of time and the second predetermined period of time are the same in length.

In still another embodiment of the invention, in the case that the cell short is detected, the third step includes a step of outputting a signal which notifies a user of an abnormality of the cell.

Thus, the invention described herein makes possible the advantages of: (1) providing a method for determining a short of a cell which is capable of detecting a cell short in a battery pack used for a hybrid electric car, etc.; (2) providing a method for determining a short of a cell which is capable of detecting a cell short in a battery pack at a low cost; and (3) providing a method for determining a short of a cell which is capable of reliably detecting a short of a cell even in the case that the voltage of a battery varies greatly according to the remaining capacitance and the charging/discharging current.

These and other advantages of the present invention will become apparent to those skilled in the art upon reading and understanding the following detailed description with reference to the accompanying figures.

BRIEF DESCRIPTION OF THE DRAWINGS

FIG. 3 is a voltage characteristic curve of the cell block according to one embodiment of the present invention in the charging and discharging processes.

FIG. 4 is a diagram illustrating an example of a grouping in the battery pack according to one embodiment of the present invention.

FIG. 5 illustrates a conventional method for determining a short in a battery.

DESCRIPTION OF THE PREFERRED EMBODIMENTS

An embodiment of the present invention will now be described with reference to the accompanying drawings.

Figure 1:
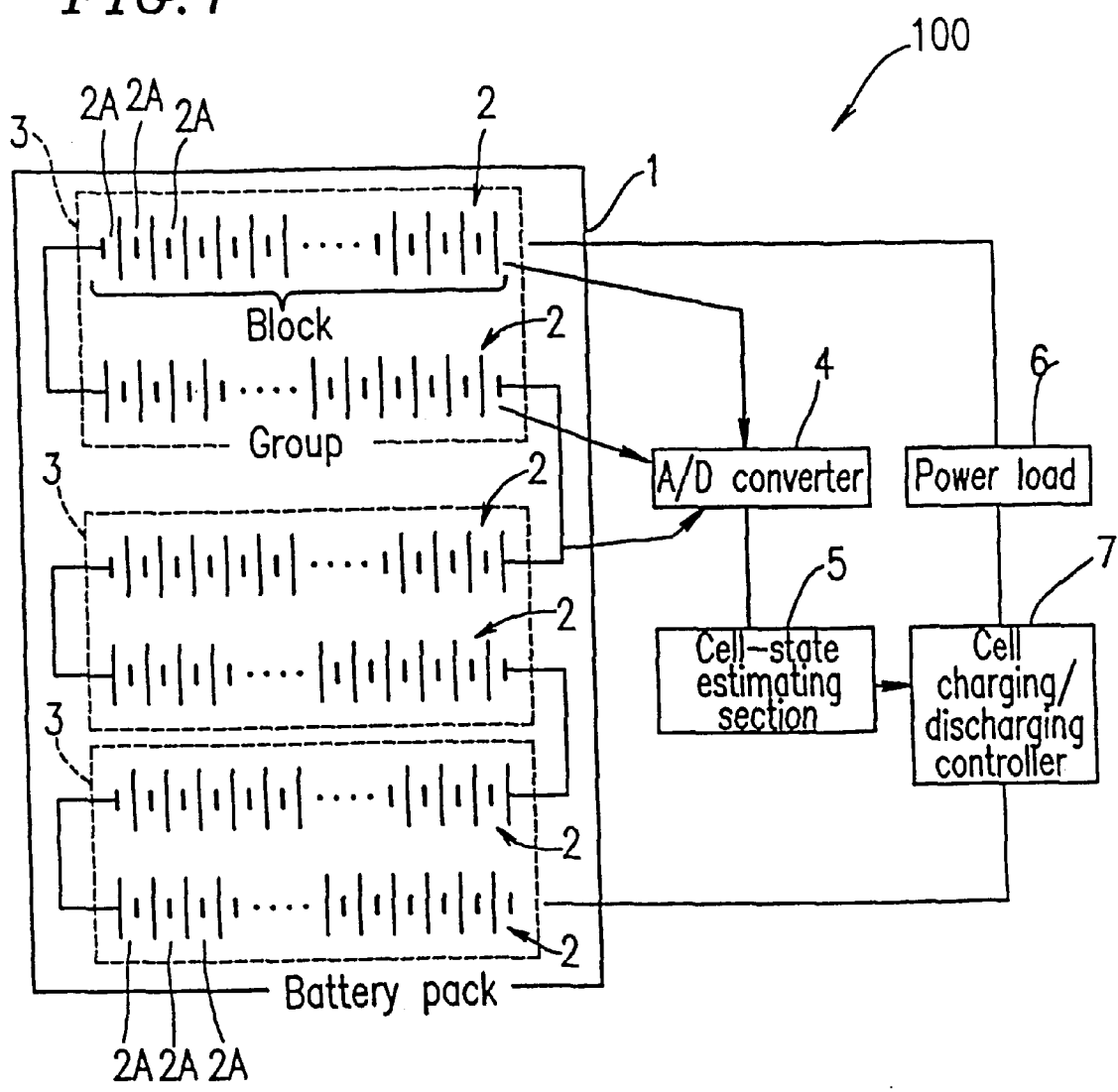
FIG. 1 is a structural diagram of an apparatus for determining a short of a cell according to one embodiment of the present invention.

FIG. 1 illustrates a structure of a cell short determining apparatus 100 according to an embodiment of the present invention. A battery pack 1 includes a plurality of cells 2A serially connected together so as to provide a sufficient electric power for driving a power load 6. The battery pack 1 includes a plurality of blocks 2, and one block includes several cells 2A. According to the temperature distribution, a plurality of blocks 2 are grouped into groups 3.

The charging/discharging current to/from the battery pack 1 is controlled by a cell charging/discharging controller 7. Voltage values from the blocks 2 are measured for each block 2 through an A/D converter 4. The A/D converter 4 is connected with a cell-state estimating section 5. The voltage value of each block 2 and the current value of each block 2 are input to the cell-state estimating section 5 via the A/D converter 4.

The cell-state estimating section 5 determines whether the block 2 in the battery pack 1 is shorted, and accurately estimates the remaining capacitance of the block 2. The cell-state estimating section 5 is typically a computer which includes a CPU and a memory. The cell-state estimating section 5 passes the remaining capacitance of the block 2 and the normal/abnormal information of each cell of the block 2 to the cell charging/discharging controller 7.

The cell charging/discharging controller 7 determines the charging/discharging current to be supplied to the battery pack 1, and the determined charging/discharging current is supplied to the battery pack 1. The cell charging/discharging controller 7 is also typically a computer which includes a CPU and a memory. The cell charging/discharging controller 7 does not have to be functionally separated from the cell-state estimating section 5, but the function can be implemented by using the same CPU.

Figure 2:
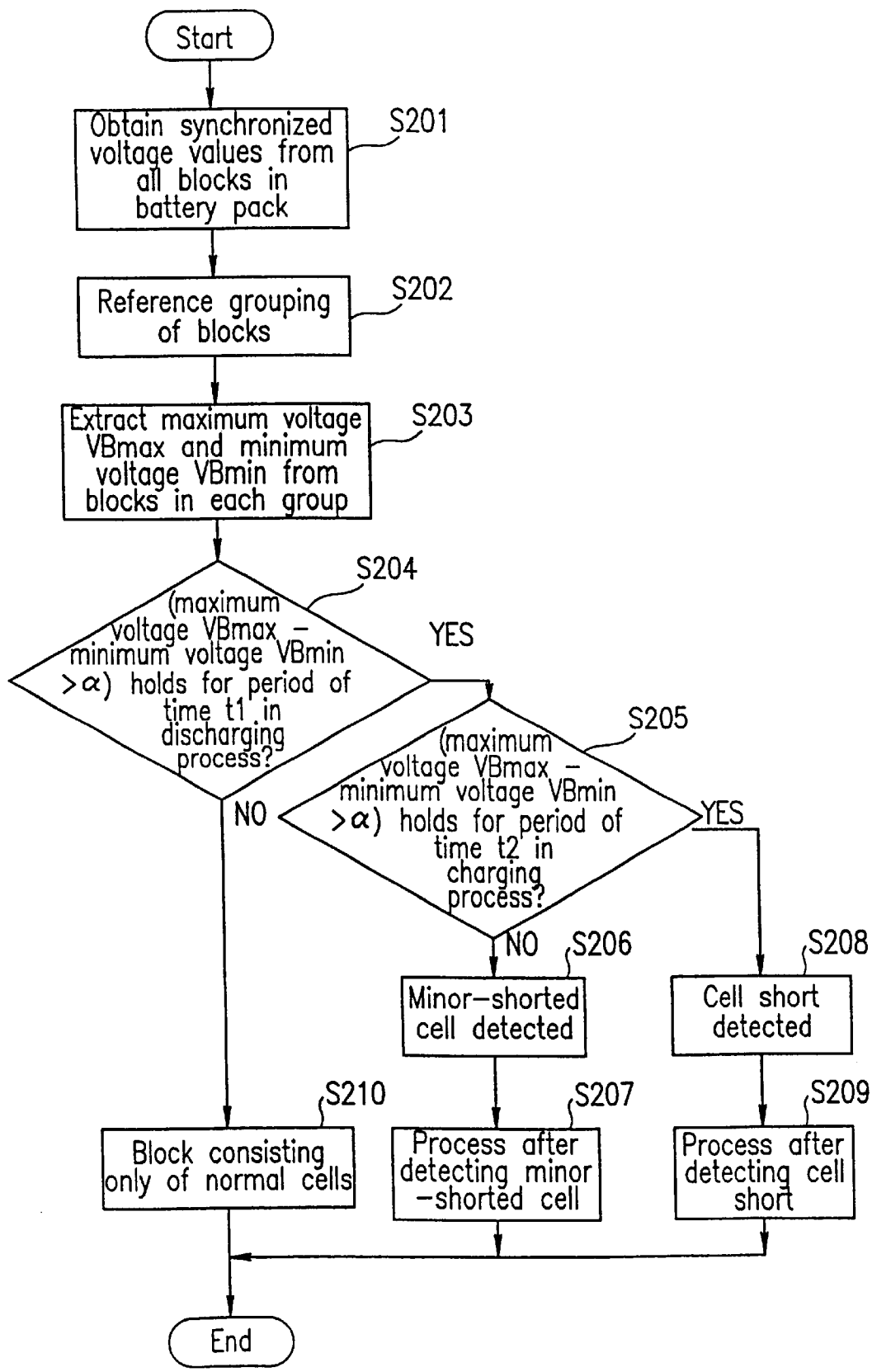
FIG. 2 is a flow chart of a cell short determining method according to one embodiment of the present invention.

FIG. 2 is a flow chart of a method for determining a short of a cell according to the embodiment of the present invention. Referring to FIG. 2, the operation of the short determining apparatus 100 having a structure shown in FIG. 1 is described in details.

The term "minor short" as used herein refers to an abnormal state of a cell, i.e., an early-stage short-circuit, in which the cell retains the same voltage as that of a normal cell in a charging process, but has a 0 V voltage in a discharging process. Accordingly, the term "minor-shorted cell" refers to a cell which has a "minor short".

The term "cell short" as used herein refers to another abnormal state of a cell, i.e., an advanced-stage short-circuit, in which the cell has a 0 V voltage in both a charging process and a discharging process. A cell having a cell short will be referred to simply as a "shorted cell".

The cell-state estimating section 5 obtains a synchronized voltage value for every block in the battery pack 1 measured by the A/D converter 4 (S201). The cell-state estimating section 5 references the grouping of the blocks 2 based on the temperature distribution across the battery pack 1 (S202).

The meaning of the grouping of the blocks 2 will be described. In a battery cell (e.g., a nickel hydrogen storage battery cell) whose charging efficiency decreases as the temperature increases, there is a difference in the remaining capacitance among cells of different positions due to a temperature distribution across the battery pack 1. As the difference in the remaining capacitance occurs, there is a difference in voltage among the individual blocks 2. A plurality of blocks in the battery pack 1 are grouped into groups each including blocks of close temperatures, thereby suppressing the difference in the remaining capacitance among the blocks 2 in the same group.

In the case that the temperature is substantially the same across the battery pack, there is of course no need of grouping. Grouping of the blocks can be defined according to temperature measurement results obtained in advance. The defined information can be stored in a program, etc. Moreover, voltages obtained in S201 are only required to be synchronized for blocks in the same group.

The cell-state estimating section 5 obtains voltages to be compared with one another within the same group. The cell-state estimating section 5 compares the voltages of each block 2 with the voltages of the other blocks belonging to the same group so that a maximum voltage VBmax and a minimum voltage VBmin are extracted (S203).

The cell-state estimating section 5 determines whether or not there is a difference in voltage between the blocks belonging to the same group in a discharging process. The cell-state estimating section 5 makes a comparison between the maximum voltage VBmax and the minimum voltage VBmin for every group 3 in the battery pack 1. The cell-state estimation section 5 determines whether or not the condition of Expression 1 below for a threshold value α holds for a predetermined period of time t1 or more in the discharging process (S204). As the threshold value α, any value may be employed according to the particular embodiment of the present invention.

$$VBmax - VBmin > \alpha \qquad \text{Expression (1)}$$

In the case the condition of Expression 1 above holds for the predetermined time t1 or more in the discharging process, the process proceeds to S205. Otherwise, the cell-state estimating section 5 determines that there is no short in the battery cells (S210).

Regarding Expression 1 above, in the case that the number (e.g., m) of cells 2A of one block 2 in which the maximum voltage VBmax has been detected is different from that (e.g., n) of another block 2 in which the minimum voltage VBmin has been detected, the following expression can be used for the determination.

$$VBmax - (VBmin \times m/n) > \alpha \qquad \text{Expression (2)}$$

The cell-state estimating section 5 determines whether or not there is a difference in voltage among the blocks 2 belonging to the same group in the charging process (S205). Also in the charging process, the determination is based on the difference in voltage between the maximum voltage VBmax and the minimum voltage VBmin. The cell-state estimating section 5 makes a comparison based on the condition of Expression 1 or 2. The cell-state estimating section 5 determines that a cell has a cell short if the condition holds for a predetermined period of time t2 or more, and it determines that a cell has a minor short if the condition does not hold for the predetermined period of time t2 or more.

In the case that the condition does not hold for the predetermined period of time t2 or more, the cell-state estimating section 5 performs a process prescribed for the case that a cell has a minor short (S207). In this process the cell-state estimating section 5 does not change a threshold value for determining a high remaining capacitance (hereinafter, the "high battery threshold") is large for the block 2 in which a minor short has been detected, but reduces a threshold value for determining a low remaining capacitance (hereinafter, the "low battery threshold") by the capacitance of one cell in the block 2 in which a minor short has been detected.

Accordingly, the time t1 and the time t2 may be the same period of time. Moreover, the threshold value used in the discharging process and the threshold value used in the charging process may be different from each other.

The remaining capacitance of the block 2 is estimated by comparing a voltage value obtained from the block 2 with a series of threshold values $\beta$. The series of threshold values $\beta$ are voltage values which are obtained as a table in advance and used for determining the remaining capacitance of each block 2 as one of a series of levels of remaining capacitance (e.g., 20%, 30%, 40%, ... ). Each of the threshold values $\beta$ is obtained based on the relationship between the current value and the voltage value of the block 2 for one remaining capacitance level. In other words, the threshold voltage values for the respective capacitance levels, i.e., $\beta$20 for 20% capacitance, $\beta$30 for a 30% capacitance, $\beta$40 for a 40% capacitance, . . . , are determined according to the current value. The voltage value obtained from each block 2 is compared with the threshold values $\beta$20, $\beta$30, $\beta$40, . . . , and the remaining capacitance of the block 2 is determined as one of the threshold values $\beta$20, $\beta$30, $\beta$40, . . . , which is closest to the voltage value obtained from the block 2. In the case that there is a minor-shorted cell, the voltage of the minor-shorted cell is 0. Thus, a correction is required to properly estimate the remaining capacitance of the block 2, i.e., the capacitance remaining in the other normal cells included in the block 2.

The correction can be made by using a series of corrected threshold values $\beta'$ instead of the threshold values $\beta$. In the case that the block including m cells is determined to have a single minor-shorted cell, each corrected threshold value $\beta'$ is obtained as shown in Expression 3 below by reducing the threshold value $\beta$ by an amount corresponding to one cell.

$$\beta' = \beta \times (m-1)/m \qquad \text{Expression (3)}$$

In the case that there is a minor short in the block 2, no voltage drop is seen in the charging process. Thus, even when the block 2 is charged without changing the high battery threshold, an overcharge is not caused. An effect of preventing a "premature low battery determination" can be expected by reducing only the low battery threshold by an amount corresponding to one cell.

Alternatively, the correction can be made by adding a voltage value which corresponds to one normal cell to the voltage value obtained from the block 2 including a minor-shorted cell in the discharging process, so that the voltage value obtained from the blocks including a minor-shorted cell can be treated in a similar manner as those obtained from other blocks 2 where a minor-shorted cell is not included. Then, the corrected voltage value can be compared with the series of threshold values $\beta$. In this way, the same effect of preventing a "premature low battery determination" can be expected.

The term "premature determination" or "premature low battery determination" as used herein refers to an erroneous estimation of the capacitance remaining in a battery pack. More specifically, "premature determination" occurs as follows. In the case that there is a minor-shorted cell, a system which is designed to automatically stop discharging for safety reasons when the battery is low underestimates the capacitance of the battery pack and stops discharging the cell prematurely even though the capacitance remaining in the cell is actually sufficient.

If cells constituting a battery constituting a battery pack are discharged in a low capacitance state, the cells would then generate heat in the discharging which may damage the cells and even the whole system in which the battery pack is incorporated. Therefore, such a system in which a battery pack is incorporated stops discharging when the capacitance of the battery pack is determined to be low. When an output voltage is low for the capacitance of the battery pack, the "premature determination" occurs.

In the case above, the output voltage value of the minor-shorted cell is 0 in the block including the minor-shorted cell. Thus, the output voltage of the block as a whole becomes low for the capacitance remaining in the other normal cells, thereby causing the "premature determination". When the "premature determination" occurs, the discharging is stopped. Therefore, the capacitance of the battery pack may not be used efficiently. As a result, a system which uses the battery pack may have a reduced operating time.

Referring to FIG. 2 again, in Step 209, the cell-state estimating section 5 performs a process prescribed for the case that a cell has a cell short (S209). When the cell-state estimating section 5 detects a cell short, it outputs an emergency signal for indicating the need of a replacement of the cell to the cell charging/discharging controller 7. The reason why the signal is output is to replace the cell before the cell is overcharged to cause a temperature rise. When the cell short is detected, the cell charging/discharging controller 7 reduces the charging/discharging current value given to the cell to a current value lower than that which is given in the normally controlled process.

FIG. 3 is a voltage characteristic graph illustrating fluctuations in voltage in one block 2 when alternately charging or discharging the cells. The horizontal axis represents time t and the vertical axis represents the voltage of the block 2. FIG. 3 illustrates fluctuations in voltage when the cells are alternately charged and discharged at regular intervals. A fixed amount of current is charged during phases 1 and 3, and a fixed amount of current is discharged during phase 2.

A thin line L1 represents fluctuations in voltage in the case that the block 2 consists of normal cells. A broken line L2 represents fluctuations in voltage in the case that the block 2 includes a minor-shorted cell. A one-dot chain line L3 represents fluctuations in voltage in the case that the block 2 includes a shorted cell.

It is assumed that at the beginning of the charging in the phase 1, the minor-shorted cell outputs a voltage which is equivalent to that of the normal cell because it is before discharging. In the phase 1, the broken line L2 shows similar fluctuations in voltage to those of the thin line L1. The one-dot chain line L3 shows a voltage value which is smaller by an amount of one cell than that of the thin line L1 which represents fluctuations in voltage of the block 2 consisting only of the normal cells because the voltage of the shorted cell is 0.

In the discharging process of the phase 2, the voltage of the broken line L2 is equivalent to that of the thin line L1 at the beginning of the discharging. However, the voltage of the minor-shorted cell becomes 0, after the discharging is continued for several seconds, and the voltage of the broken line L2 decreases by the amount of one cell in comparison with that of the thin line L1. The voltage value of the one-dot chain line L3 becomes smaller by the amount of one cell than that of the thin line L1 as in the phase 1.

In the charging process of the phase 3, the voltage value of the cell which is minor-shorted is 0 at the beginning of the charging due to the influence from the discharging process. Therefore, the voltage of the broken line L2 is lower by the amount of one cell than that of the thin line L1. However, the voltage value of the minor-shorted cell returns to the voltage value which is equivalent to that of the normal cell after the charging is continued for several seconds, and the voltage of the block also returns to the voltage value which is equivalent to that of the thin line L1. The voltage value of the one-dot chain line L3 becomes smaller by the amount of one cell than that of the thin line L1 as in the phase 1.

Based on the voltage characteristics seen over the phases 1, 2 and 3, it is possible to distinguish the following three types of blocks: a normal block; a block including a minor-shorted cell; and a block including a shorted cell.

Each of the groups 3 in the battery pack 1 includes the blocks 2 whose remaining capacitances are close to one another. Therefore, if there is a block 2 having a voltage which is lower by the amount of one cell than those of the other blocks 2, the block 2 will always be the block of the lowest voltage in the group 3. Accordingly, comparing a maximum voltage value with a minimum voltage value of each of the blocks 2 in the same group, wherein those values are synchronously obtained is a comparison in voltage between the blocks consisting only of the normal cells and a block having a strong probability of including a minor-shorted or shorted cell.

A block including a minor-shorted or shorted cell and a block consisting only of the normal cells can be distinguished from each other based on the difference in voltage therebetween in the discharging process. The voltage of the cell which is minor-shorted or shorted becomes 0 in the discharging process. Therefore, it is possible to determine whether a block includes a minor-shorted or shorted cell by determining whether the difference in voltage by the amount of one cell occurs in the same group.

The distribution between a block including a minor-shorted cell and a block including a shorted cell can be made in the charging process. Even if the minor-shorted cell has a 0 value of voltage at the beginning of the charging, the voltage returns to its normal value after a continuous charging for several seconds. While a shorted cell remains a 0 value of voltage at all times. Accordingly, it is possible to determine whether the block includes a shorted cell or a minor-shorted cell by determining whether or not the difference in voltage by the amount of one cell continues to exist for the predetermined time t2 or more.

FIG. 4 illustrates one example of the grouping of the blocks in the battery pack 1 according to an embodiment of the present invention. The grouping is made based on the temperature distribution across the pack in the process of charging or discharging the battery pack 1. The temperature of the cells rises in a short period of time by frequently charging and discharging the battery pack 1. When the temperature of a cell becomes high, the rated capacitance of the cell is reduced and the available capacitance level of the cell is also reduced. Therefore, a fan may be used for cooling the battery pack 1. In FIG. 4, the air from the fan is directed toward the battery pack 1 from a position below the battery pack 1.

In FIG. 4, for the purpose of discussion, the battery pack 1 has three groups A, B and C arranged in this order from the top for convenience. The grouping is required to prevent unevenness in temperature among the cells in the same group. A difference in capacitance among block occurs if the unevenness of the temperature occurs in the same group. The difference in capacitance is the difference in voltage among the blocks. Therefore, if an unevenness of the temperature in the same group is significant, a normal block may be misdetected as a block having a "cell short".

As described above, if the charging and discharging processes are repeated, cells generate heat which will reduce the amount of electric power that can be stored in the cells. Therefore, cells are cooled by using the fan. In the case of providing the air from the fan from a position below the cells, cells in lower parts of the pack are exposed to the air more intensively. Accordingly, the temperature of the cells becomes lower in the lower parts.

In the case of cooling the battery pack by using the fan from a position below the pack, the cooling efficiency is weaker in the upper parts. Therefore, a temperature distribution occurs across the pack. As the temperature is higher in the upper parts of the pack, the pack is divided into groups along the direction which is perpendicular to the direction in which the air is blown.

FIG. 4 illustrates an example where the cells of the pack are grouped into three groups, each group including two layers. In FIG. 4, one layer includes three blocks 2. Therefore, each of three groups (group A, group B and group C) includes six blocks. Accordingly, by grouping the cells in the battery pack 1 based on the temperature distribution across it, unevenness in capacitance among the cells in the group may be prevented.

It is preferred that cells are grouped with the same grouping each time the battery pack is used. If the grouping changes each time the battery pack is used, there is an increased possibility that there will occur a difference in capacitance, and thus a difference in voltage, among cells in the same group. Therefore, it is preferred that the grouping for a battery pack is determined after a sufficient amount of cell charging/discharging tests.

The minor short detection method and the cell short detection method of the present invention may be used with a single cell. In other words, the present invention can be used in an embodiment where the number of the cells 2A shown in FIG. 1 is just one, i.e., where a single cell is provided in place of the battery pack 1.

In such a case, the voltage of the cell is measured during the discharging process and during the charging process, and the measured voltage is compared with a predetermined threshold value which is determined to suit the particular embodiment of the invention, so as to determine the state of the cell (i.e., one of a "normal" cell, a "minor-shorted" cell and a "shorted" cell). Specifically, the cell is determined to be a minor-shorted cell if the voltage thereof is smaller than the threshold value for a predetermined period of time t1' or more in the discharging process and if the voltage thereof is not smaller than the threshold value for a predetermined period of time t2' or more in the charging process. The cell is determined to be a shorted cell if the voltage thereof is smaller than the threshold value for the predetermined period of time t1' or more in the discharging process and if the voltage thereof is smaller than the threshold value for the predetermined period of time t2' or more in the charging process. The period of time t1' and the period of time t2' may be the same in length. Different threshold values may be used in the discharging process and in the charging process, respectively.

Moreover, in the minor short detection method and the cell short detection method of the present invention, either the measurement of the voltage of a block (or a cell) in the discharging process or that in the charging process may precede the other.

EFFECTS OF THE INVENTION

As described above, the present invention provides a method for determining a short of a cell which is capable of detecting a cell short in a hybrid electric car.

The present invention further provides a method for determining a short of a cell which is capable of detecting a short of a cell at a low cost.

The present invention further provides a method for determining a short of a cell which is capable of reliably detecting a short of a cell even in the case that the voltage of a cell varies greatly according to the remaining capacitance and the charging/discharging current.

Moreover, according to the present invention, a plurality of cells in a battery pack are grouped into a plurality of blocks which are in turn grouped into groups. Voltage values are synchronously measured from a number of blocks which belong to the same group. The minor short or cell short determination is made based on a condition that the difference between the maximum and minimum voltage values among the measured voltage values is greater than a threshold value α for a predetermined period of time or more. It is determined that the group includes a shorted cell if this condition is satisfied both in the charging process and in the discharging process. It is determined that the group includes a minor-shorted cell if the condition is satisfied only in the discharging process. Thus, it is possible to identify an abnormal group, and in turn an abnormal block, in an early stage, thereby preventing the shorted state of the group (block) from getting worse.

Thus, the present invention provides a number of advantages as follows over the prior art.

(1) When a minor-shorted cell is detected, the lowest threshold value for estimating the remaining capacitance for the block including the minor-shorted cell is reduced by an amount corresponding to one cell so that the capacitance remaining in the block can be estimated accurately. Thus, it is possible to prevent the available capacity of a battery pack from decreasing so as to prevent the operating time of the system using the battery pack from being reduced. Moreover, by limiting the amount of input/output electric power to/from a minor-shorted cell, it is possible to prevent the state of the short from getting worse so as to prolong the life of the cell.

(2) When a shorted cell is detected, an emergency signal is output to prompt a quick replacement of the shorted cell so that the shorted cell is replaced before the cell causes an increase in temperature because of an overcharge and thus an adverse influence to the other components in the system.

According to the present invention, the means for determining a short of a cell can detect a minor short, which is an early-stage short-circuit which may lead to a cell short. Then the charging/discharging current to/from such a cell can be appropriately controlled so that it is possible to slow down the progress of the state of the short-circuited and to correctly estimate the capacity remaining in the battery pack, thereby preventing the available capacity of the battery pack from being reduced.

Various other modifications will be apparent to and can be readily made by those skilled in the art without departing from the scope and spirit of this invention. Accordingly, it is not intended that the scope of the claims appended hereto be limited to the description as set forth herein, but rather than the claims be broadly construed.

What is claimed is:

1. A method for detecting a minor short in at least one of a plurality of cells of a battery pack, the method comprising:

a first step of measuring a voltage of at least one of the plurality of cells in a process of charging the battery pack;

a second step of measuring a voltage of the at least one of the plurality of cells in a process of discharging the battery pack; and a third step of detecting the minor short in the at least one of the plurality of cells based on measurement results from the first step and the second step.

2. A method according to claim 1, wherein:

the battery pack includes a plurality of blocks serially connected together;

each of the blocks includes a number of cells among the plurality of cells which are serially connected together;

the first step comprises measuring a voltage of each of at least two of the plurality of blocks in the charging process;

the second step comprises measuring a voltage of the at least two of the plurality of blocks in the discharging process;

the third step comprises a fourth step of determined whether any of the cells of the at least two blocks has a minor short; and the fourth step comprises determining that at least one of the cells of the at least two blocks has a minor short if a condition that a difference in voltage between the two blocks is greater than a first predetermined threshold value holds for a first predetermined period of time or more in the discharging process and if the condition does not hold for a second predetermined period of time or more in the charging process.

3. A method according to claim 2, wherein:

the plurality of blocks are grouped into a plurality of groups based on a previously measured temperature distribution among the blocks, each of the groups including at least two blocks; and the fourth step is performed based on a condition that a difference in voltage between two blocks in the same group is greater than the first predetermined threshold value.

4. A method according to claim 2, wherein:

the third step comprises a fifth step of estimating a remaining capacitance from the voltage of the at least two blocks; and in the case that a minor-shorted cell is detected in the fourth step, the fifth step subtracts a voltage value which corresponds to the first predetermined threshold value from a second threshold value predetermined for estimating the remaining capacitance to obtain a third threshold value, and compares the voltage value measured in the second step with the third threshold value.

5. A method according to claim 2, wherein:

the third step comprises a sixth step of estimating a remaining capacitance from the voltages of the at least two blocks; and in the case that a minor-shorted cell is detected in the fourth step, the sixth step adds the voltage value which corresponds to the first predetermined threshold value to the voltage value measured in the second step from the block comprising the minor-shorted cell to obtain an adjusted voltage value, and compares the adjusted voltage value with a second threshold value predetermined for estimating the remaining capacitance.

6. A method according to claim 2, wherein the first predetermined period of time and the second predetermined period of time are the same in length.

7. A method according to claim 1, wherein in the case that the minor short is detected, the third step comprises a step of reducing a charging/discharging current value given to the battery pack to be smaller than that which is given in the normally controlled process.

8. A method for detecting a cell short in at least one of a plurality of cells of a battery pack, the method comprising:
a first step of measuring a voltage of at least one of the plurality of cells in a process of charging the battery pack;
a second step of measuring a voltage of at least one of the plurality of cells in a process of discharging the battery pack; and
a third step of detecting the cell short in the at least one of the plurality of cells based on measurement results from the first step and the second step.

9. A method according to claim 8, wherein:
the battery pack includes a plurality of blocks serially connected together;
each of the blocks includes a number of cells among the plurality of cells which are serially connected together;
the first step comprises measuring a voltage of at least two of the plurality of blocks in the charging process;
the second step comprises measuring a voltage of the at least two of the plurality of blocks in the discharging process;
the third step comprises a fourth step of determining whether any of the cells of the at least two blocks has a cell short; and
the fourth step comprises determining that at least one of the cells of the at least two blocks has a cell short if a condition that a difference in voltage between the two blocks is greater than a first predetermined threshold value holds for a first predetermined period of time or more in the discharging process and if the condition holds for a second predetermined period of time or more in the charging process.

10. A method according to claim 9, wherein:
the plurality of blocks are grouped into a plurality of groups based on a previously measured temperature distribution among the blocks, each of the groups including at least two blocks; and
the fourth step is performed based on a condition that a difference in voltage between two blocks in the same group is greater than the first predetermined threshold value.

11. A method according to claim 9, wherein the first predetermined period of time and the second predetermined period of time are the same in length.

12. A method according to claim 8, wherein in the case that the cell short is detected, the third step comprises a step of outputting a signal which notifies a user of an abnormality of the battery pack.

13. A method for detecting a minor short in a cell, the method comprising:
a first step of measuring a voltage of the cell in a process of charging the cell;
a second step of measuring a voltage of the cell in a process of discharging the cell; and
a third step of detecting the minor short in the cells based on measurement results from the first step and the second step.

14. A method according to claim 13, wherein the third step comprises determining that the cell has a minor short if a condition that a voltage of the cell is smaller than a first predetermined threshold value holds for a first predetermined period of time or more in the discharging process and if the condition does not hold for a second predetermined period of time or more in the charging process.

15. A method according to claim 14, wherein the first predetermined period of time and the second predetermined period of time are the same in length.

16. A method according to claim 13, wherein in the case that the minor short is detected, the third step comprises a step of reducing a charging/discharging current value given to the battery pack to be smaller than that which is given in the normally controlled process.

17. A method for detecting a cell short in a cell, the method comprising:
a first step of measuring a voltage of the cell in a process of charging the cell;
a second step of measuring a voltage of the cell in a process of discharging the cell; and
a third step of detecting the cell short based on measurement results from the first step and the second step.

18. A method according to claim 17, wherein the third step comprises determining that the cell has a cell short if a condition that a voltage of the cell is smaller than a first predetermined threshold value holds for a first predetermined period of time or more in the discharging process and if the condition holds for a second predetermined period of time or more in the charging process.

19. A method according to claim 18, wherein the first predetermined period of time and the second predetermined period of time are the same in length.

20. A method according to claim 17, wherein in the case that the cell short is detected, the third step comprises a step of outputting a signal which notifies a user of an abnormality of the cell.

* * * * *